United States Patent [19]

Bergemont et al.

[11] Patent Number: 5,760,458

[45] Date of Patent: Jun. 2, 1998

[54] BIPOLAR-BASED ACTIVE PIXEL SENSOR CELL WITH POLY CONTACT AND INCREASED CAPACITIVE COUPLING TO THE BASE REGION

[75] Inventors: Albert Bergemont; Min-Hwa Chi, both of Palo Alto, Calif.

[73] Assignee: Foveonics, Inc., Cupertino, Calif.

[21] Appl. No.: 735,025

[22] Filed: Oct. 22, 1996

[51] Int. Cl.$^6$ .................. H01L 27/082; H01L 27/102; H01L 29/70; H01L 31/11

[52] U.S. Cl. .................. 257/588; 250/208.1; 257/290; 257/291; 257/448; 257/587; 257/503; 257/754; 257/756; 438/57; 438/97

[58] Field of Search .................. 257/290, 291, 257/443, 448, 587, 588, 457, 458, 503, 736, 754, 756, 786; 437/4; 250/208.1; 438/57, 97

[56] References Cited

U.S. PATENT DOCUMENTS

| | | | |
|---|---|---|---|
| 4,814,846 | 3/1989 | Matsumoto et al. | 357/30 |
| 4,847,668 | 7/1989 | Sugawa et al. | 357/30 |
| 4,952,788 | 8/1990 | Berger et al. | 250/208.1 |
| 4,972,243 | 11/1990 | Sugawa et al. | 357/30 |
| 5,097,305 | 3/1992 | Mead et al. | 35/30 |
| 5,235,195 | 8/1993 | Tran et al. | 257/59 |
| 5,241,169 | 8/1993 | Ohzu | 250/208.1 |
| 5,260,592 | 11/1993 | Mead et al. | 257/291 |
| 5,262,850 | 11/1993 | Hashimoto | 358/500 |
| 5,283,428 | 2/1994 | Morishita et al. | 250/214.1 |
| 5,285,091 | 2/1994 | Hamasaki | 257/292 |
| 5,289,023 | 2/1994 | Mead | 257/291 |
| 5,324,958 | 6/1994 | Mead et al. | 257/291 |
| 5,406,332 | 4/1995 | Shinohara et al. | 348/308 |
| 5,411,900 | 5/1995 | Nagel | 437/34 |
| 5,429,980 | 7/1995 | Yang et al. | 437/52 |
| 5,501,998 | 3/1996 | Chen | 437/52 |
| 5,502,330 | 3/1996 | Johnson et al. | 257/588 |
| 5,506,430 | 4/1996 | Ohzu | 257/292 |
| 5,552,619 | 9/1996 | Bergemont et al. | 257/291 |
| 5,557,131 | 9/1996 | Lee | 257/370 |
| 5,566,044 | 10/1996 | Bergemont et al. | 361/321.1 |
| 5,581,112 | 12/1996 | Li et al. | 257/557 |
| 5,592,017 | 1/1997 | Johnson | 257/554 |

FOREIGN PATENT DOCUMENTS

| | | | |
|---|---|---|---|
| 0 562 523 A1 | 9/1993 | European Pat. Off. | H01L 27/146 |
| 1-15967 | 1/1989 | Japan | H01L 27/14 |

OTHER PUBLICATIONS

U.S. application No. 08/696,063 [NSC1-A5500], Bergemont, et al., filed Aug. 13, 1996.

U.S. application No. 08/438,347 [NSC1-62200], Bergemont, et al., filed May 10, 1995.

Fossum, Eric R., "Active-Pixel Sensors Challenge CCDs," *Laser Focus World*, Jun. 1993, pp. 83–87.

U.S. application No. 08/696,065 [NSC1-A6200], Chi et al., filed Aug. 13, 1996.

*Primary Examiner*—Mahshid D. Saadat
*Assistant Examiner*—Allan R. Wilson
*Attorney, Agent, or Firm*—Limbach & Limbach L.L.P.

[57] ABSTRACT

The dynamic range is increased and the noise level is reduced in a bipolar-based active pixel sensor cell with a capacitively coupled base region by forming the capacitor over a portion of the base region and the field oxide region of the cell. In addition, the noise levels are also reduced by heavily-doping the material which forms a portion of the bottom plate of the capacitor with the same conductivity type as the base region of the cell, and by placing the material which forms the portion of the bottom plate in direct contact with the base region.

27 Claims, 9 Drawing Sheets

BIPOLAR-BASED ACTIVE PIXEL SENSOR CELL WITH POLY CONTACT AND INCREASED CAPACITIVE COUPLING TO THE BASE REGION

RELATED APPLICATIONS

This application is related to Ser. No. 08/735,009 for Bipolar-Based Active Pixel Sensor Cell with Metal Contact and Increased Capacitive Coupling to the Base Region filed by Albert Bergemont et al. on Oct. 22, 1996.

BACKGROUND OF THE INVENTION

1. Field of the Invention

The present invention relates to bipolar-based active pixel sensor cells and, more particularly, to a bipolar-based active pixel sensor cell with a poly contact and increased capacitive coupling to the base region of the cell.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use bipolar-based active pixel sensor cells to convert a pixel of light energy into an electrical signal. FIG. 1 shows an example of a conventional bipolar-based active pixel sensor cell 10 with a capacitively coupled base region.

As shown in FIG. 1, cell 10 includes an n-well 14, which functions as a collector, formed in a p-type substrate 12; a p-type region 16, which functions as a base, formed in collector region 14; and an n+ region 18, which functions as an emitter, formed in base region 16.

In addition, cell 10 also includes a field oxide region FOX formed in collector region 14 adjoined to base region 16, a first n+ polysilicon (poly) line 20 formed on emitter region 18, a layer of gate oxide 22 formed on base region 16 and poly line 20, and a second n+ polysilicon (poly) line 24 formed on the field oxide region FOX and the layer of gate oxide 22.

Poly line 24 is conventionally doped n+ rather than p+ because additional masking steps would be required to dope poly line 24 with a p-type material. In addition, a p-type material heavily implanted into poly line 24 can easily diffuse into and damage the layer of gate oxide 22.

Operation of active pixel sensor cell 10 is performed in two steps: an image integration step, where the light energy is collected and converted into an electrical signal; and a signal readout step, where the signal is read out.

At the beginning of the image integration step, the base-emitter junction is reverse-biased by applying a fixed voltage to poly line 24. The voltage applied to poly line 24 is capacitively coupled to base region 16 by a coupling capacitor that utilizes a portion of poly line 24 as the top plate, gate oxide layer 22 as the dielectric, and a portion of base region 16 as the bottom plate. In addition, the collector-base junction is also reverse-biased by applying a fixed voltage, such as Vcc, to collector region 14.

During the image integration step, light energy, in the form of photons, strikes cell 10, thereby creating a number of electron-hole pairs. Under these conditions, the holes formed in base region 16 remain in base region 16, while the holes formed in collector region 14 and emitter region 18 diffuse to base region 16, where each additional hole in base region 16 increases the charge on base region 16.

At the end of the integration step, cell 10 is read out by pulsing poly line 24 with a positive voltage which, in turn, increases the voltage on base region 16. The increased voltage on base region 16, in combination with the increased charge due to the collected holes, forward-biases the base-emitter junction causing an amplified current to flow from emitter region 18 into poly line 20 that is proportional to the number of collected holes.

One problem with cell 10, however, is that the capacitance of the coupling capacitor is relatively low due to the limited area that is available to form the capacitor. As a result, the fixed and pulsed voltages present on base region 16 are substantially less than the fixed and pulsed voltages applied to poly line 24, thereby limiting the dynamic range of cell 10.

Another problem with cell 10 is that the voltage placed on poly line 24 may cause the surface of base region 16 to become inverted, thereby effectively increasing the size of emitter region 18. By increasing the effective size of emitter region 18, the leakage current associated with the p-n junction also increases, thereby increasing the noise level.

Thus, there is a need for a bipolar-based active pixel sensor cell that increases the dynamic range of the cell, and reduces the noise associated with the cell.

SUMMARY OF THE INVENTION

Conventionally, the dynamic range of a bipolar-based active pixel sensor cell with a capacitively coupled base region is limited, in part, by the capacitance of the coupling capacitor used to reverse-bias the base-emitter junction during image collection. In addition, conventional base-coupled cells also suffer from increased noise levels due to the tendency of the surface of the base region to invert when the base-emitter junction is reverse-biased.

The present invention increases the dynamic range of a base-coupled active pixel sensor cell by increasing the area, and therefore the capacitance, of the coupling capacitor. In the present invention, the size of the coupling capacitor is increased by forming the capacitor over a portion of both the base region and the field oxide region of the cell. In addition, the noise levels are also reduced by heavily-doping the material which forms a portion of the bottom plate of the capacitor with the same conductivity type as the base region of the cell, and by placing the material which forms the portion of the bottom plate in direct contact with the base region.

In the present invention, a bipolar-based active pixel sensor cell, which is formed in a substrate of a first conductivity type, includes a collector region of a second conductivity type formed in the substrate, a base region of the first conductivity type formed in the collector region, and an emitter region of the second conductivity type formed in the base region. In addition, the cell also includes a field oxide region formed in the collector region adjoining the base region, and a first conductive line formed on the emitter region.

In accordance with the present invention, the cell further includes a layer of conductive material formed on a portion of the field oxide region and the base region, a layer of dielectric material formed on the layer of conductive material, and a second conductive line formed over the layer of dielectric material and a portion of the field oxide region.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
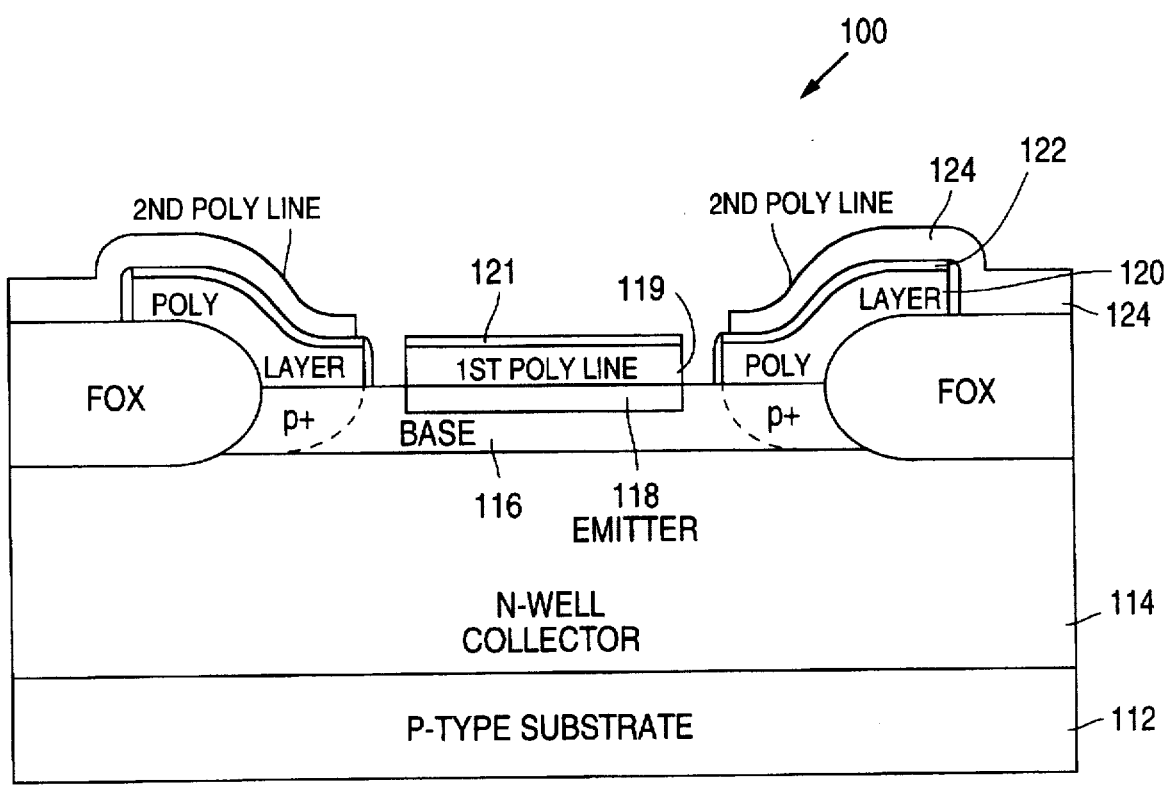
FIG. 2 is a cross-sectional drawing illustrating a bipolar-based active pixel sensor cell 100 in accordance with the present invention.

FIG. 2 shows a cross-sectional drawing that illustrates a bipolar-based active pixel sensor cell 100 in accordance with the present invention. As shown in FIG. 2, cell 100 includes an n-well 114, which functions as a collector, formed in a p-type substrate 112; a p-type region 116, which functions as a base, formed in collector region 114; and an n+ region 118, which functions as an emitter, formed in base region 116.

In addition, cell 100 also includes a field oxide region FOX that is formed in collector region 114 adjoining base region 116, a first heavily-doped n-type polysilicon (poly) line 119 formed on emitter region 118, and a first layer of dielectric material 121 formed over poly line 119.

In accordance with the present invention, cell 100 further includes a heavily-doped p-type polysilicon (poly) layer 120 formed on a portion of the field oxide region FOX and base region 116; a second layer of dielectric material 122 formed on poly layer 120; and a second heavily-doped n-type polysilicon line 124 formed over the second layer of dielectric material 122 and a portion of the field oxide region FOX. Alternately, poly line 124 can be doped with a p-type material instead of an n-type material.

Figure 1:
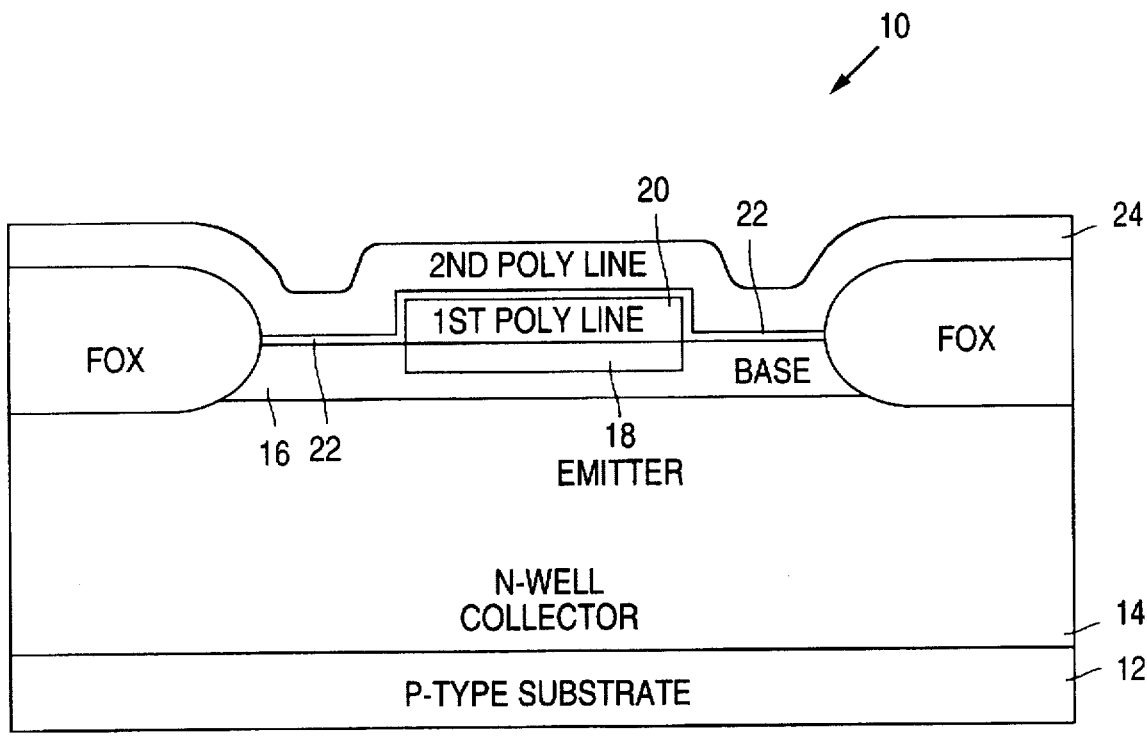
FIG. 1 is a cross-sectional diagram illustrating a conventional bipolar-based active pixel sensor cell 10.

The operation of cell 100 is the same as cell 10 of FIG. 1 except that the fixed and pulsed voltages applied to poly line 24 are instead applied to poly line 124. The voltages applied to poly line 124 are capacitively coupled to base region 116 by a coupling capacitor that utilizes poly line 124 as the top plate, the second layer of dielectric material 122 as the dielectric, and poly layer 120 and base region 116 as the bottom plate.

One of the advantages provided by the present invention is that the area of the coupling capacitor, and therefore the capacitance, is significantly increased by forming the coupling capacitor over a portion of the field oxide region FOX. By increasing the capacitance of the coupling capacitor, the dynamic range of cell 100 is also significantly increased. In addition, the size of the coupling capacitor can be further increased by using a multi-layer structure similar to those used in DRAM structures.

Another advantage, as further shown in FIG. 2, is that by heavily-doping poly layer 120, some of the p+ dopants will diffuse into base region 116 during the thermal processing steps used to form cell 100, thereby forming p+ regions at the surface of base region 116.

By forming p+ regions at the surface of base region 116, the surface of base region 116 will remain in accumulation during operation, thereby preventing the effective increase of emitter region 118 and the consequent increase in leakage current. In addition, the problems associated with boron damage to the gate oxide layer are eliminated in the present invention because the gate oxide layer has been eliminated from cell 100.

A further advantage is that the present invention can be incorporated into a conventional CMOS double-poly fabrication process with the addition of three extra masking steps. FIGS. 3A-3G show cross-sectional drawings that illustrate the formation of cell 100 in accordance with the present invention.

Figure 3A:
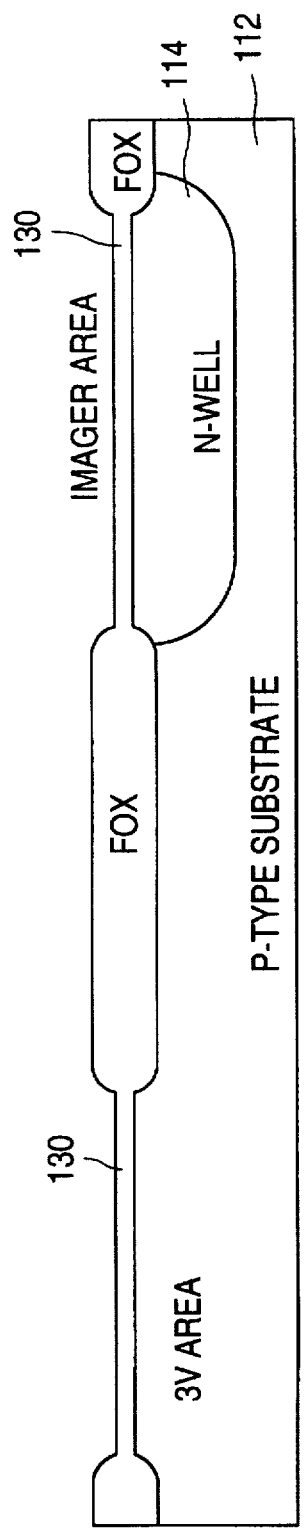
FIGS. 3A-3G are cross-sectional drawings illustrating the formation of cell 100 in accordance with the present invention.
Figure 4:
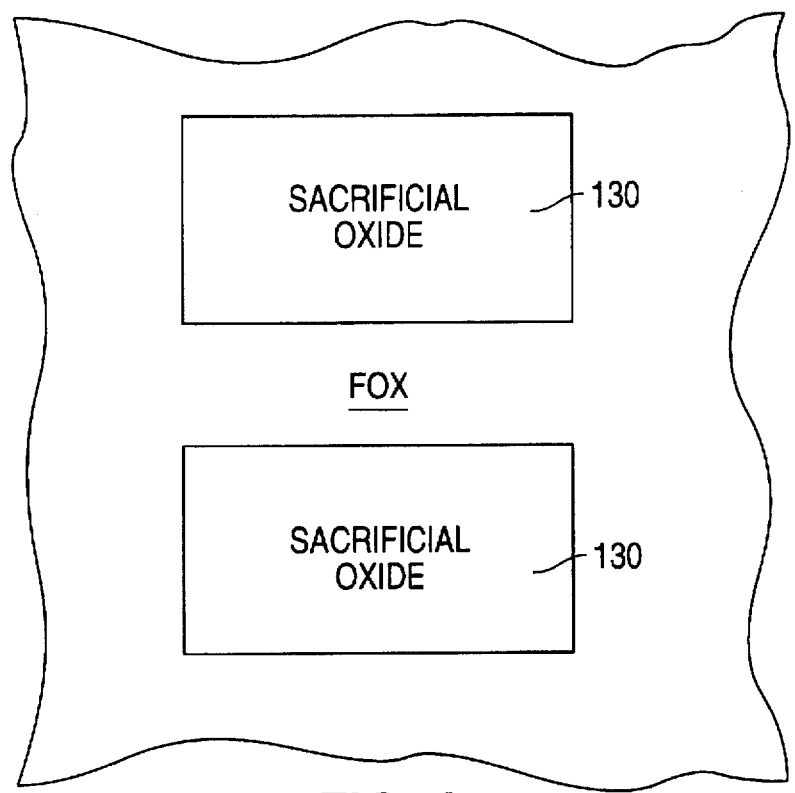
FIG. 4 is a plan view illustrating the formation of cell 100 after the formation of sacrificial layer 130.

As shown in FIG. 3A, the process of the present invention begins with the conventional formation of an n-well region (114) and a p-well region (not shown) in a p-type substrate (112), followed by the formation of a field oxide region FOX by the well-known local oxidation of silicon (LOCOS) process. After this, a layer of sacrificial oxide 130 approximately 400 Å thick is formed over the wells and the exposed regions of substrate 112. FIG. 4 shows a plan view that illustrates the formation of cell 100 after the formation of sacrificial layer 130.

Figure 3B:
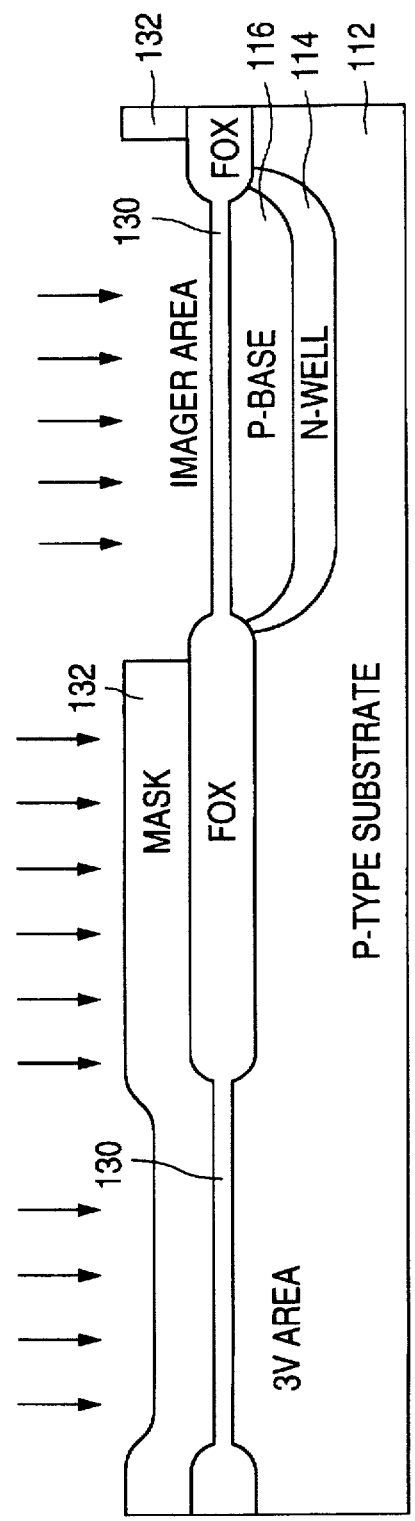

Turning now to FIG. 3B, after sacrificial oxide layer 130 has been formed, a base mask 132 is formed and patterned to expose n-well 114. Following this, boron is implanted into n-well 114 at a dose of approximately $10^{13}$–$10^{14}$ cm$^{-2}$ and implant energy of approximately 40–100 KeV to form base region 116. The implant dose and energy will determine the depth of the base which, in turn, defines the beta of the bipolar transistor. Once base region 116 has been formed, mask 132 is removed.

Figure 3C:
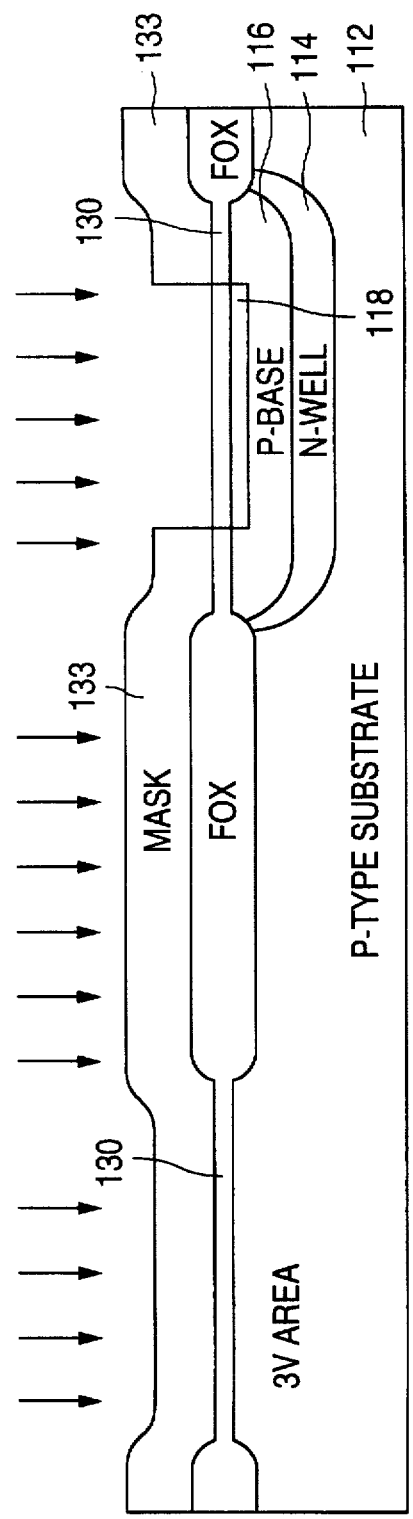

Next, as shown in FIG. 3C, emitter region 118 can optionally be formed at this point by forming and patterning an emitter mask 133 on sacrificial layer 130 to expose an area of base region 116. With this option, the unmasked area of base region 116 is implanted with arsenic or other similar materials at a dose of approximately $10^{15}$–$10^{16}$ cm$^{-2}$ and implant energy of approximately 30–100 KeV to form emitter region 118. Once emitter region 118 has been formed, mask 133 and oxide layer 130 are removed.

If emitter region 118 is not formed at this point, sacrificial oxide layer 130 is removed following the removal of mask 132. In addition, if emitter region 118 is formed at this point, sacrificial oxide layer 130 can be removed after mask 132 has been removed, and replaced with a new layer of sacrificial oxide.

Figure 3D:
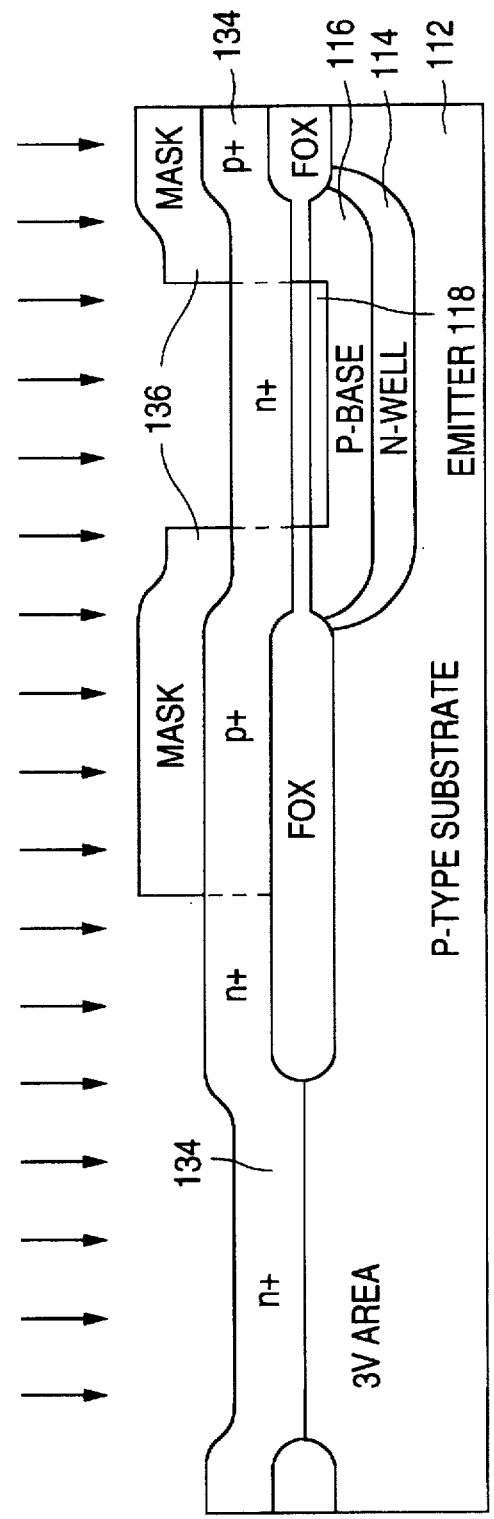

Turning now to FIG. 3D, after the above steps have been completed, a first layer of polysilicon 134 is next deposited on the exposed regions of substrate 112, base 116, emitter 118, and the field oxide regions FOX. Following this, a first dopant mask 136 is formed and patterned to expose selected regions of poly layer 134. Next, the exposed regions of poly layer 134 are doped with arsenic at a dose of approximately $10^{15}$–$10^{16}$ cm$^{-2}$ and implant energy of approximately 30–100 KeV to form n+ regions within poly layer 134. Following this, mask 136 is removed.

Alternately, if emitter region 118 was not formed as shown in FIG. 3C, emitter region 118 can be formed at this point by doping poly layer 134 with arsenic at a dose of approximately $10^{16}$ cm$^{-2}$ and an implant energy of approximately 30–100 KeV. The effectiveness of forming emitter region 118 during this step is a function of how many subsequent thermal processing cycles are available which, in turn, cause the n-type dopants to diffuse into base region 116. The optional step discussed above with respect to FIG. 3C provides a more well defined emitter region, but requires the use of an additional mask.

Figure 5A:
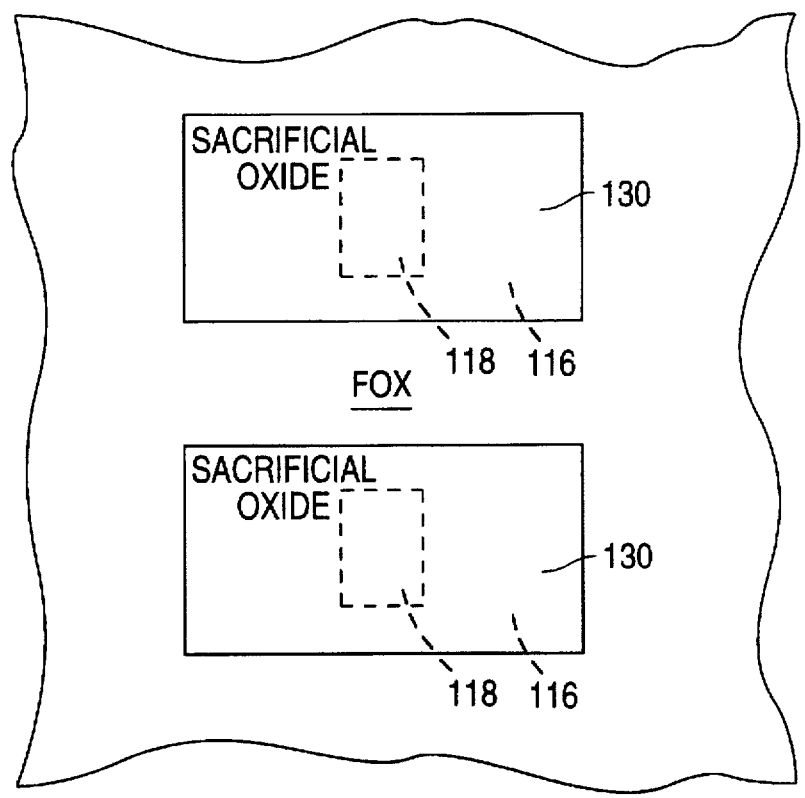
FIGS. 5A-5B are plan views illustrating the formation of cell 100 after the formation of emitter region 118.
Figure 5B:
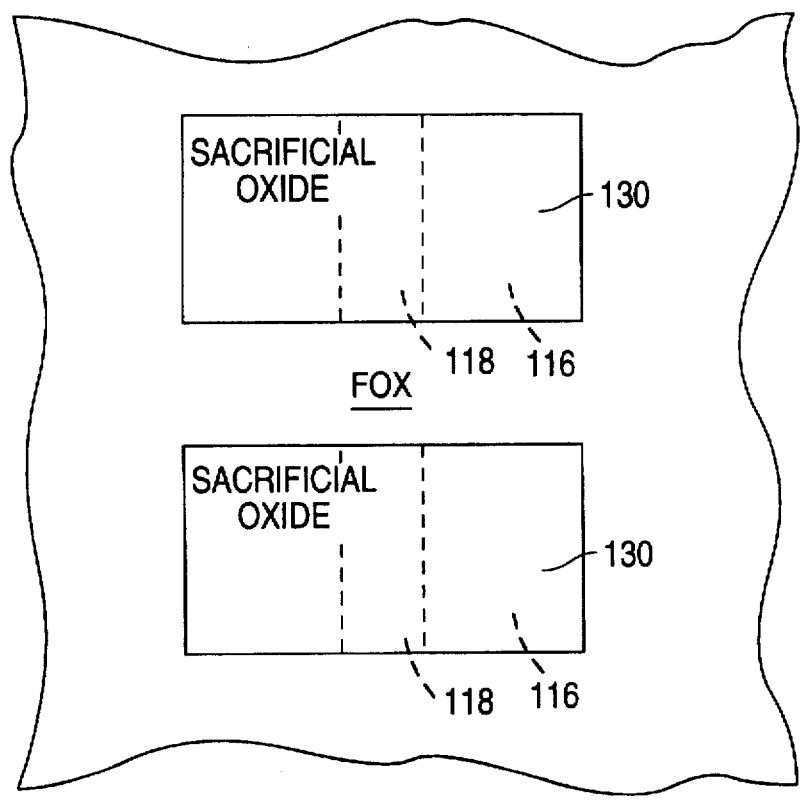

FIGS. 5A–5B show plan views that illustrates the formation of cell 100 after the formation of emitter region 118. As shown in FIG. 5A, emitter region 118 can be coapletely surrounded by base region 116 or, as shown in FIG. 5B, can abut the field oxide region FOX.

Figure 3E:
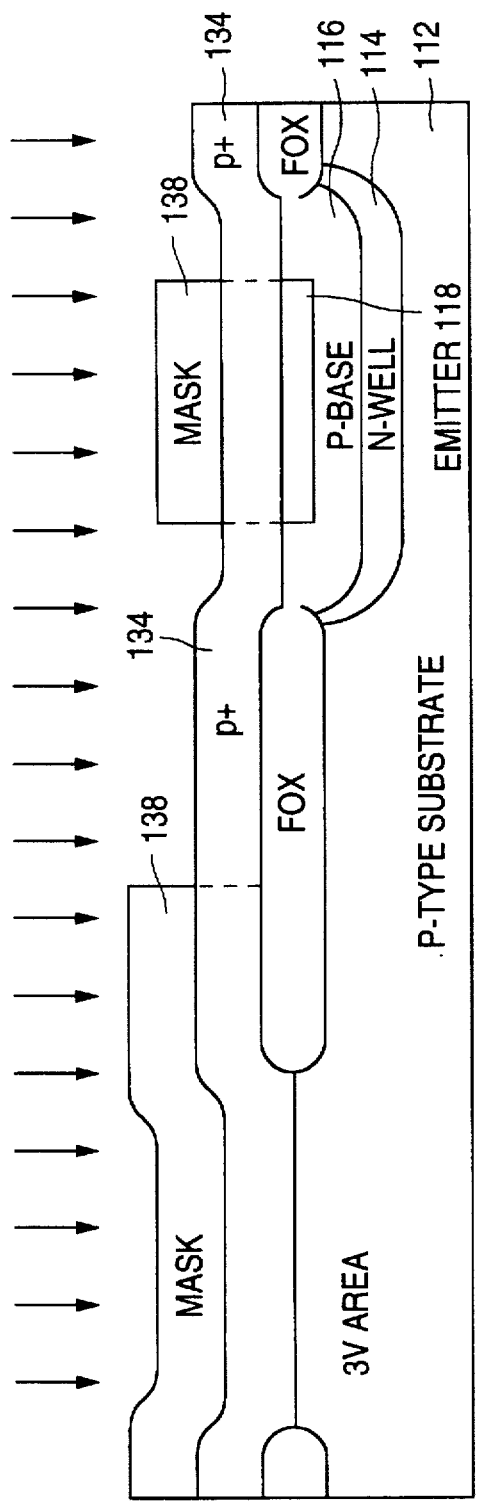

Turning now to FIG. 3E, once mask 136 has been removed, a second dopant mask 138 is formed and patterned to again expose selected regions of poly layer 134. Next, the exposed regions of poly layer 134 are doped with boron, BF$_2$, or other similar materials at a dose of approximately $10^{15}$$10^{16}$ cm$^{-2}$ and implant energy of approximately 20–50 KeV to form p+regions within poly layer 134. Following this, mask 138 is removed. Alternately, the order of doping can be reversed so that poly layer 134 is first doped with the p-type material.

Figure 3F:
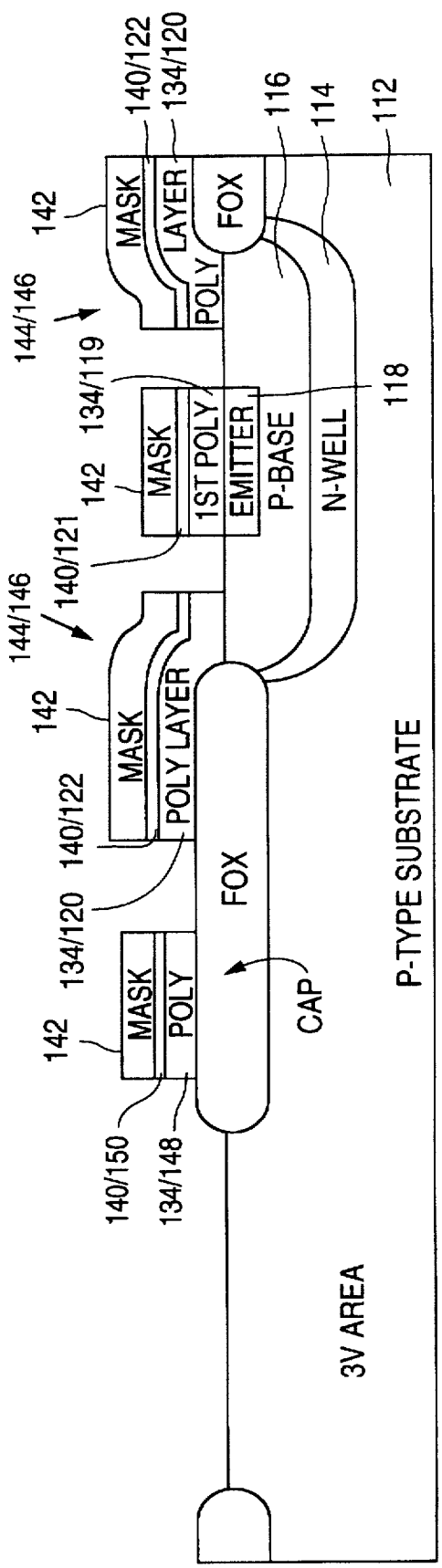

Turning now to FIG. 3F, once polysilicon layer 134 has been doped, a layer of dielectric material 140, such as oxide-nitride-oxide (ONO), is deposited over the layer of polysilicon 134. Next, a poly mask 142 is formed and patterned on ONO layer 140 to define the structures formed from poly layer 134 and ONO layer 140.

After poly mask 142 has been formed, the unmasked regions of ONO layer 140 and the underlying poly layer 134 are removed to form ONO layer 121 over poly line 119, stacked ONO/poly structures 144, or alternately, stacked ONO/poly strips 146, a capacitor dielectric layer 150, and an underlying lower capacitor plate 148 of a capacitor Cap associated with the CMOS circuitry.

Figure 6:
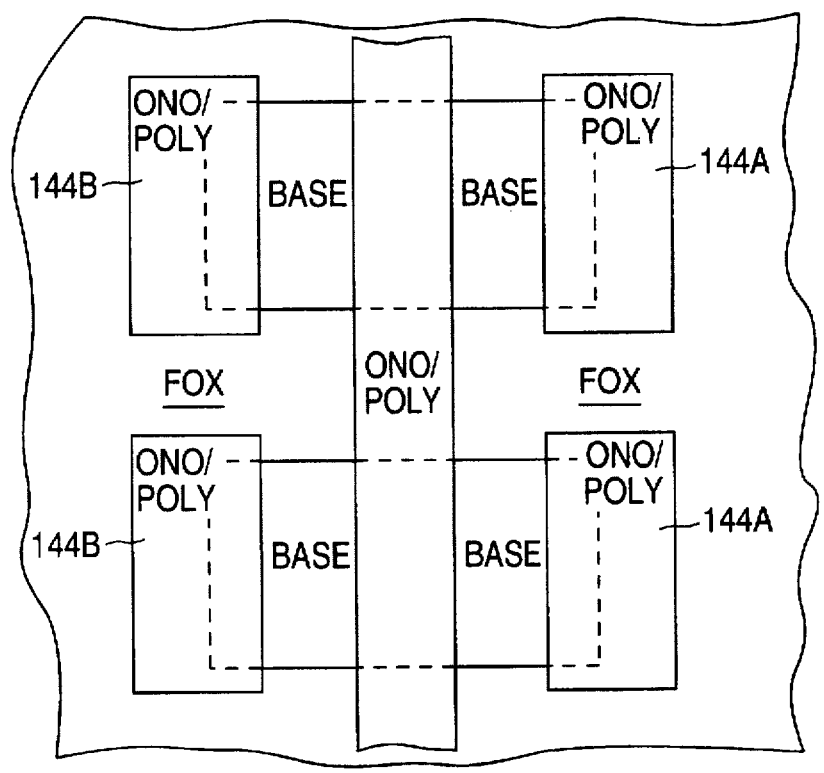
FIG. 6 is a plan view illustrating the formation of cell 100 after the etching of ONO layer 140 and polysilicon layer 134 to form stacked ONO/poly structures 144.
Figure 7:
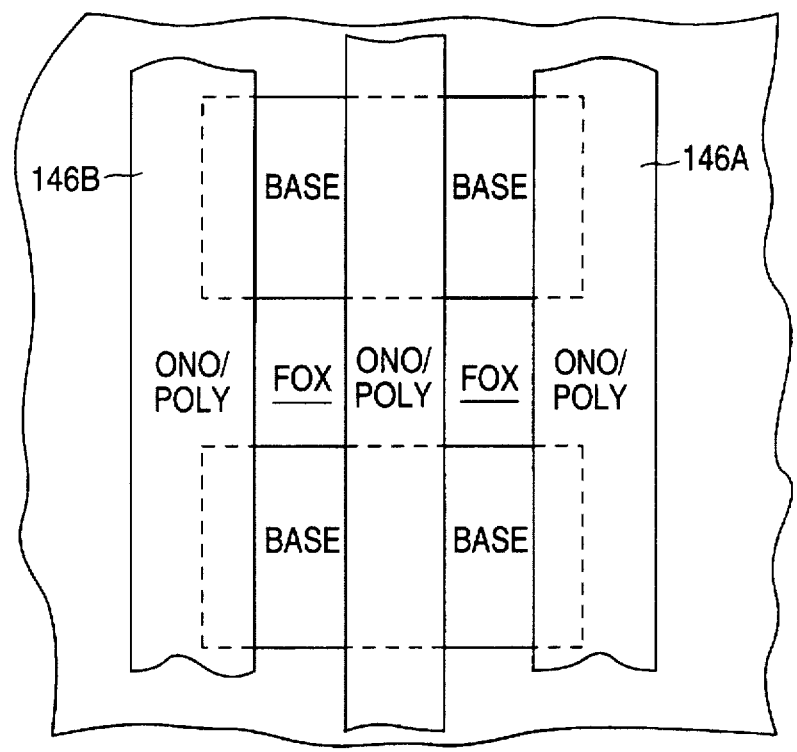
FIG. 7 is a plan view illustrating the formation of cell 100 after the etching of ONO layer 140 and polysilicon layer 134 to form stacked ONO/poly strips 146.

FIG. 6 shows a plan view that illustrates the formation of cell 100 after the formation of stacked ONO/poly structures 144. FIG. 7 shows a plan view that illustrates the formation of cell 100 after the formation of stacked ONO/poly strips 146.

One of the advantages of the present process is that the formation of stacked ONO/poly structures 144 and strips 146 is insensitive to misalignment errors. As shown in FIGS. 6 and 7, if stacked ONO/poly structures 144-A or strips 146-A are shifted right due to a misalignment error, thereby reducing the amount of poly layer 120 that is in contact with the right-side of base region 116, then stacked ONO/poly structures 144-B or strips 146-B will also be shifted right, thereby increasing the amount of poly layer 120 that is in contact with left-side of base region 116 by an equal amount. As a result, regardless of any misalignment errors, the same amount of poly layer 120 will remain in contact with base region 116.

After stacked ONO/poly structures 144 or strips 146 have been formed, a p-channel threshold voltage mask (not shown) is formed and patterned to expose the p-channel regions of substrate 112. Following this, boron is implanted in the p-channel regions to set the threshold voltages of the to-be-formed-p-channel CMOS devices. The p-channel threshold voltage mask is then removed and the process is repeated to set the threshold voltages of the n-channel CMOS devices.

Figure 3G:
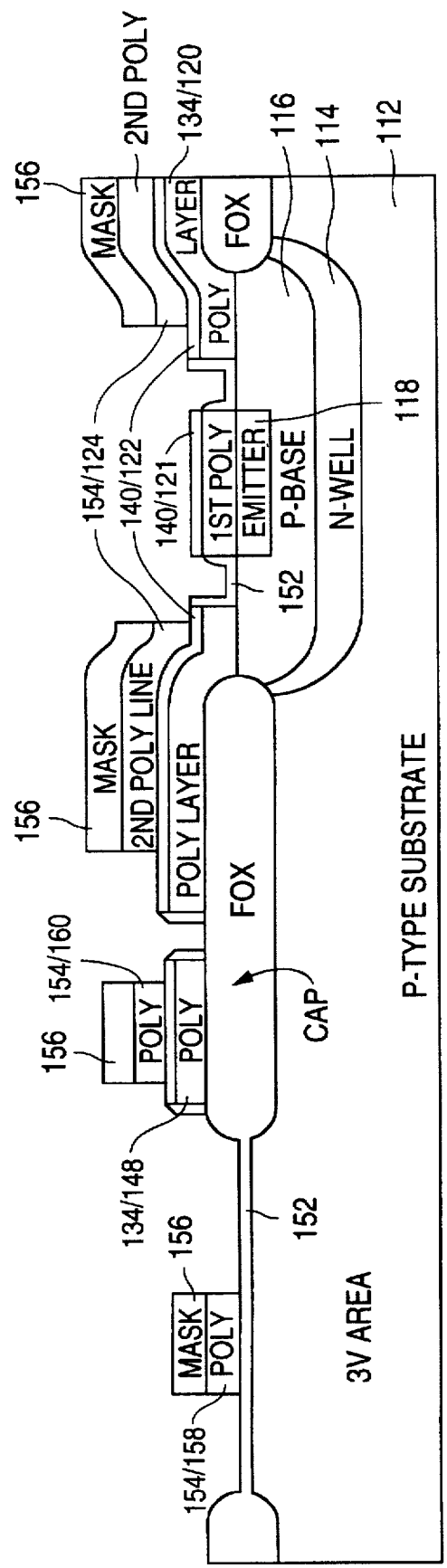

Next, as shown in FIG. 3G, a layer of gate oxide 152 is grown over substrate 112 in the n and p-channel regions as well as over the exposed regions of base region 116. In addition to forming the layer of gate oxide 152, this oxidation step also seals the sides of poly line 119, poly layer 120, and poly plate 148. Alternately, ONO layer 140 can be deposited after poly layer 134 has been defined to seal the sides of poly line 119, poly layer 120, and poly plate 148. ONO layer 140 provides a better seal, but requires an additional masking step.

One of the advantages to utilizing ONO layer 140 to form the layer of dielectric material 122 of the coupling capacitor rather than using the layer of gate oxide, as is conventionally the case, is that the thickness of the layer of gate oxide 152 can now be optimized to the needs of the CMOS devices.

Returning to FIG. 3G, after the gate oxide layer 152 has been formed, a second layer of polysilicon 154 is deposited and doped. Following this, a poly mask 156 is formed and patterned to define the structures formed from poly layer 154.

Next, the unmasked regions of polysilicon layer 154 are removed to form second poly lines 124, the gates 158 of the n and p-channel CMOS devices, and the top plate 160 of the capacitor Cap associated with the CMOS circuitry.

Figure 8:
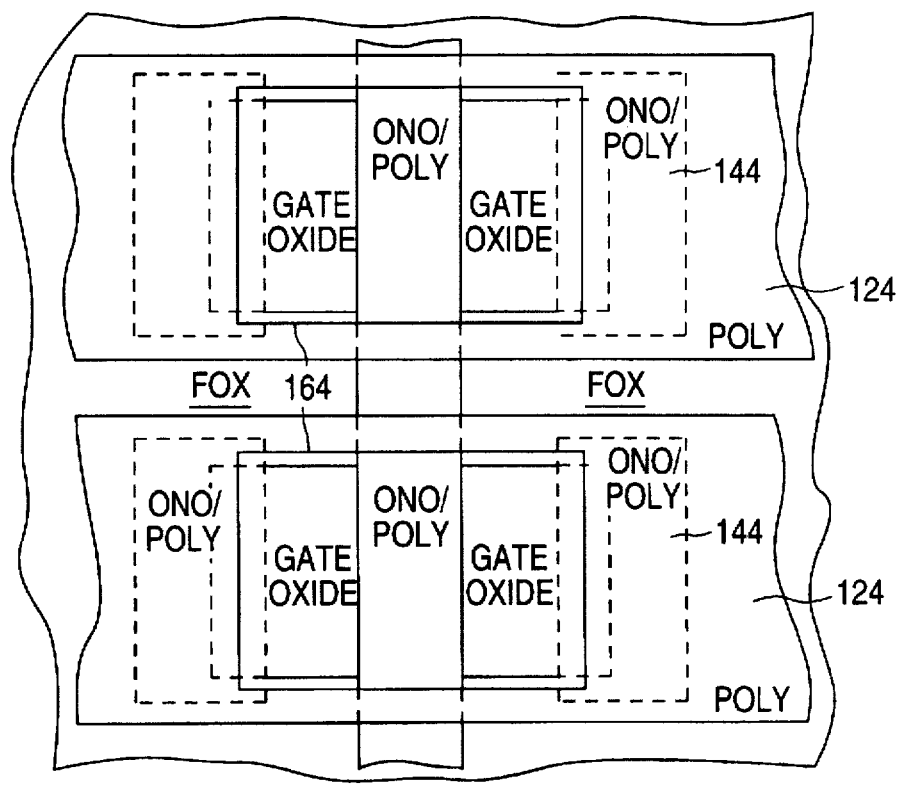
FIG. 8 is a plan view illustrating the formation of cell 100 after the etching of polysilicon layer 154.

FIG. 8 shows a plan view of cell 100 following the etching of poly layer 154. As shown in FIG. 8, poly layer 154 is formed with an opening 164 which is slightly larger than the gate-oxide covered base area. By utilizing a slightly larger opening, poly layer 154 also becomes insensitive to misalignment errors. Alternately, other sized openings may be formed in poly layer 154.

Figure 9:
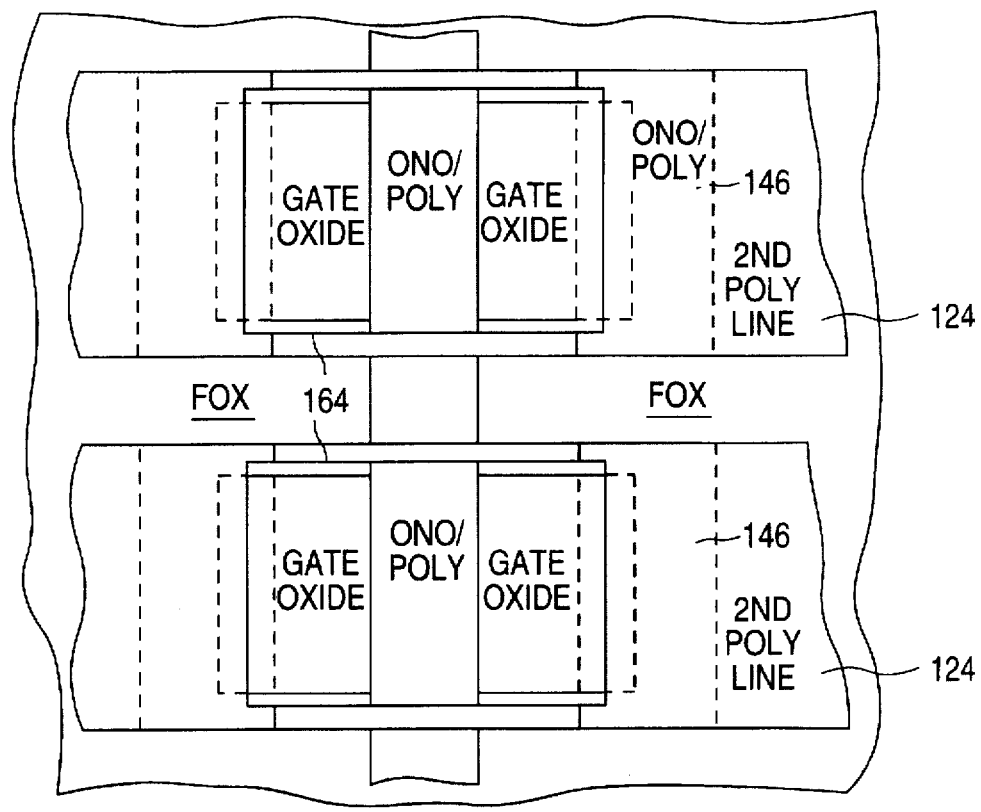
FIG. 9 is a plan view illustrating the formation of cell 100 after the self-aligned etching of polysilicon layer 154.

If stacked ONO/poly strips 146 are utilized, then mask 156 is hardened and a second mask (not shown) is formed and patterned to protect first poly line 119 and the periphery. Hardened mask 156 and the second mask are then used as a self-aligned mask to define stacked ONO/poly structures as shown in FIG. 9. Following this, the second mask and mask 156 are removed.

Once the masks have been removed, a layer of oxide (not shown) is formed to seal the sidewalls of poly layer 124, gates 158, and top plates 160. After this, conventional rear-end processing steps are followed, e.g., pldd, nldd, p+, and n+ implants, along with contact and via formation.

Thus, a process has been described for forming cell 100 in a CMOS process flow that requires three additional masking step: the use of base mask 132; the use of dopant mask 136; and the use of dopant mask 138.

Figure 10:
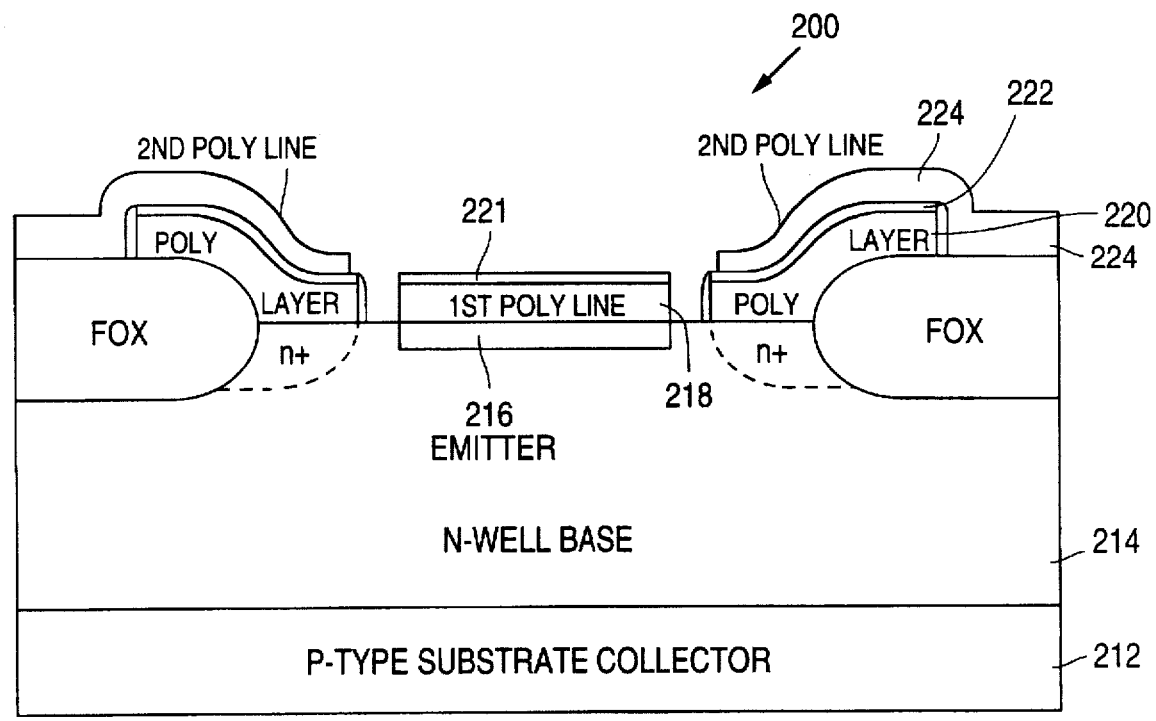
FIG. 10 is a cross-sectional diagram of a p-n-p bipolar cell 200 in accordance with the present invention.

In addition to using an n-p-n bipolar cell, a p-n-p bipolar cell can also be used. FIG. 10 shows a cross-sectional diagram of a p-n-p bipolar cell 200 in accordance with the present invention.

As shown in FIG. 9, cell 200 includes an n-well 214, which functions as the base region, formed in a p-type substrate 212, which functions as the collector region; and a p-type region 216, which functions as the emitter region, formed in base region 214.

In addition, cell 200 also includes a field oxide region FOX, a heavily-doped p-type polysilicon line 218, a first layer of dielectric material 221 formed on poly line 218, a heavily-doped n-type polysilicon layer 220, a layer of dielectric material 222 formed on poly layer 220; and a heavily-doped n-type polysilicon line 224 formed over the layer of dielectric material 222 and a portion of the field oxide region FOX.

The drawback to using cell 200 is that n-well 214 is substantially deeper than base region 116 of cell 100. As a result, cell 200 will have a lower beta and, therefore, a lower current amplification. Cell 200 can also be formed in accordance with the process steps discussed with respect to FIGS. 3A–3G, adjusted accordingly for the change from a n-p-n to a p-n-p bipolar cell.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An active pixel sensor cell formed in a substrate of a first conductivity type, the cell comprising:

a collector region of a second conductivity type formed in the substrate;

a base region of the first conductivity type formed in the collector region;

an emitter region of the second conductivity type formed in base region;

a field oxide region FOX formed in the collector region adjoining the base region;

a first conductive line formed to contact the emitter region;

a first region of conductive material formed on a first portion of the field oxide region and the base region;

a layer of dielectric material formed on the first region of conductive material; and a second conductive line formed over the layer of dielectric material, the second conductive line being spaced apart from the collector region, the base region, and the emitter region.

2. The cell of claim 1 and further comprising a second region of conductive material formed on a second portion of the field oxide region and the base region, and wherein the layer of dielectric material is also formed on the second region of conductive material.

3. The cell of claim 1 wherein the first region of conductive material is formed to have the first conductivity type.

4. The cell of claim 1 wherein the first region of conductive material is heavily doped.

5. The cell of claim 2 wherein the second region of conductive material is formed to have the first conductivity type.

6. The cell of claim 2 wherein the second region of conductive material is heavily doped.

7. The cell of claim 1 wherein the first region of conductive material includes polysilicon.

8. The cell of claim 2 wherein the second region of conductive material includes polysilicon.

9. The cell of claim 1 wherein the first conductive line includes polysilicon.

10. The cell of claim 1 wherein the second conductive line is formed over a portion of the first conductive line.

11. An active pixel sensor cell formed in a substrate of a first conductivity type, the cell comprising:

a base region of the second conductivity type formed in the substrate;

an emitter region of the first conductivity type formed in base region;

a field oxide region FOX formed in the substrate to adjoin the base region;

a first conductive line formed on the emitter region;

a first region of conductive material formed on a first portion of the field oxide region and the base region;

a layer of dielectric material formed on the first region of conductive material; and a second conductive line formed over the layer of dielectric material, the second conductive line being spaced apart from the collector region, the base region, and the emitter region.

12. The cell of claim 11 and further comprising a second region of conductive material formed on a second portion of the field oxide region and the base region, and wherein the layer of dielectric material is also formed on the second region of conductive material.

13. The cell of claim 11 wherein the first region of conductive material is formed to have the first conductivity type.

14. The cell of claim 11 wherein the first region of conductive material is heavily doped.

15. The cell of claim 12 wherein the second region of conductive material is formed to have the first conductivity type.

16. The cell of claim 12 wherein the second region of conductive material is doped.

17. The cell of claim 2 wherein the second conductive line is formed over the layer of dielectric formed over the second region of conductive material.

18. The cell of claim 17 wherein the second conductive line is formed to expose a portion of the base region.

19. The cell of claim 12 wherein the second conductive line is formed over the layer of dielectric formed over the second region of conductive material.

20. The cell of claim 19 wherein the second conductive line is formed to expose a portion of the base region.

21. The cell of claim 1 wherein the emitter region is spaced apart from the field oxide region.

22. The cell of claim 1 wherein the emitter region adjoins the field oxide region.

23. The cell of claim 11 wherein the emitter region is spaced apart from the field oxide region.

24. The cell of claim 11 wherein the emitter region adjoins the field oxide region.

25. The cell of claim 1 wherein the second conductive line is also formed over a portion of the field oxide region.

26. The cell of claim 11 wherein the second conductive line is also formed over a portion of the field oxide region.

27. The cell of claim 11 wherein the second conductive line is formed over a portion of the first conductive line.

\* \* \* \* \*